United States Patent
Chen et al.

(10) Patent No.: US 11,075,653 B2
(45) Date of Patent: Jul. 27, 2021

(54) POLAR CODE ENCODING AND DECODING METHOD AND APPARATUS

(71) Applicant: HUAWEI TECHNOLOGIES CO., LTD., Guangdong (CN)

(72) Inventors: Ying Chen, Hangzhou (CN); Yunfei Qiao, Hangzhou (CN); Jun Wang, Hangzhou (CN); Gongzheng Zhang, Hangzhou (CN); Hejia Luo, Hangzhou (CN); Rong Li, Hangzhou (CN); Lingchen Huang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 81 days.

(21) Appl. No.: 16/671,763

(22) Filed: Nov. 1, 2019

(65) Prior Publication Data
US 2020/0067531 A1    Feb. 27, 2020

Related U.S. Application Data

(63) Continuation of application No. PCT/CN2018/085457, filed on May 3, 2018.

(30) Foreign Application Priority Data

May 3, 2017    (CN) .......................... 201710302992.7

(51) Int. Cl.
    *H03M 13/13*    (2006.01)
    *H04L 1/00*     (2006.01)
    *H03M 13/00*    (2006.01)

(52) U.S. Cl.
    CPC ......... *H03M 13/13* (2013.01); *H03M 13/611* (2013.01); *H03M 13/635* (2013.01);
    (Continued)

(58) Field of Classification Search
    CPC ............... H03M 13/13; H03M 13/611; H03M 13/6318; H03M 13/635; H04L 1/0052;
    (Continued)

(56) References Cited

U.S. PATENT DOCUMENTS 10,333,560 B2 *    6/2019    Hui .................. H03M 13/6306
10,341,044 B2 *    7/2019    Zhang ................... H04L 1/0057
(Continued)

FOREIGN PATENT DOCUMENTS

CN    102694625    9/2012
CN    103023618    4/2013
(Continued)

OTHER PUBLICATIONS

Condo et al., Efficient Bit-Channel Reliability Computation for Multi-Mode Polar Code Encoders and Decoders, May 16, 2017, IEEE, pp. 1-6, (Year: 2017).*
(Continued)

*Primary Examiner* — John J Tabone, Jr.
(74) *Attorney, Agent, or Firm* — Womble Bond Dickinson (US) LLP

(57) ABSTRACT

Embodiments of this application provide a polar code encoding and decoding method and apparatus. The method includes: obtaining an information bit set from a polar code construction sequence table based on an information bit length and a target code length of to-be-encoded information, where the polar code construction sequence table stores a mapping relationship between an encoding parameter and a construction sequence corresponding to the encoding parameter, the construction sequence is a sequence representing an order of reliability of polarized channels, and the encoding parameter includes at least one of an aggregation level, the target code length, and a mother code length, or the encoding parameter is a maximum mother code length; and
(Continued)

Obtain an information bit set from a polar code construction sequence table based on an information bit length and a target code length of to-be-encoded information, where the polar code construction sequence table stores a mapping relationship between an encoding parameter and a construction sequence corresponding to the encoding parameter, the construction sequence is a sequence representing an order of reliability of polarized channels, and the encoding parameter includes at least one of an aggregation level, the target code length, and a mother code length, or the encoding parameter is a maximum mother code length — S101

Perform polarization encoding on the to-be-encoded information based on the to-be-encoded information and the information bit set — S102 performing polarization encoding on the to-be-encoded information based on the to-be-encoded information and the information bit set.

17 Claims, 4 Drawing Sheets

(52) U.S. Cl.
CPC ...... *H03M 13/6318* (2013.01); *H04L 1/0043* (2013.01); *H04L 1/0052* (2013.01); *H04L 1/0057* (2013.01); *H04L 1/0067* (2013.01); *H04L 1/0072* (2013.01)

(58) Field of Classification Search
CPC ... H04L 1/0057; H04L 1/0067; H04L 1/0043; H04L 1/0072
USPC ................................ 714/752, 759, 786, 799
See application file for complete search history.

(56) References Cited

U.S. PATENT DOCUMENTS

| | | | |
|---|---|---|---|
| 10,432,234 B2* | 10/2019 | Wu .................. | H03M 13/6362 |
| 10,892,849 B2* | 1/2021 | Chen .................. | H03M 13/635 |
| 2007/0217703 A1* | 9/2007 | Kajiwara .............. | H04N 19/50 |
| | | | 382/238 |
| 2015/0194987 A1 | 7/2015 | Li et al. | |
| 2016/0013810 A1 | 1/2016 | Gross et al. | |
| 2016/0254876 A1* | 9/2016 | Shen .................... | H03M 13/13 |
| | | | 714/776 |
| 2018/0076922 A1* | 3/2018 | Zhang .................. | H04L 1/0009 |
| 2019/0123853 A1* | 4/2019 | Zhang .................. | H04L 1/0068 |
| 2019/0165813 A1* | 5/2019 | Liu ..................... | H03M 13/616 |
| 2019/0199474 A1* | 6/2019 | Chen .................. | H03M 13/353 |
| 2019/0207709 A1* | 7/2019 | Chen .................... | H03M 13/13 |
| 2019/0260392 A1 | 8/2019 | Huazi Zhang et al. | |
| 2019/0268022 A1* | 8/2019 | Xu ....................... | H03M 13/13 |
| 2019/0312675 A1* | 10/2019 | Yokomakura ......... | H03M 13/09 |
| 2020/0021315 A1* | 1/2020 | Chen ..................... | H03M 13/13 |
| 2020/0021392 A1* | 1/2020 | Xu ........................ | H04L 1/0041 |
| 2020/0028619 A1* | 1/2020 | Maevskii .............. | H04L 1/0013 |
| 2020/0059253 A1* | 2/2020 | Chen ..................... | H04L 1/0041 |
| 2020/0059934 A1* | 2/2020 | Zhang ................. | H03M 13/616 |

FOREIGN PATENT DOCUMENTS

| | | |
|---|---|---|
| CN | 103684477 A | 3/2014 |
| CN | 105684316 A | 6/2016 |
| CN | 106100794 | 11/2016 |
| CN | 107342846 A | 11/2017 |
| CN | 107800510 A | 3/2018 |

OTHER PUBLICATIONS

Niu et al., Polar Codes: Primary Concepts and Practical Decoding Algorithms, Jul. 2014, IEEE, pp. 192-203 (Year: 2014).*
Written Opinion of the International Searching Authority for PCT/CN2018/085457, dated Jul. 25, 2018. (Year: 2018).*
Huawei et al:"Polar code design and rate matching",3GPP Draft; R1-167209,Aug. 21, 2016 (Aug. 21, 2016), XP051140577,total 5 pages.
Intel Corporation: "Polar code constructions for evaluations",3GPP Draft; R1-164185,May 14, 2016 (May 14, 2016), XP051090073,total 2 pages.
Qualcomm Incorporated:"Polar code information bit allocation and nested extension construction",3GPP Draft; R1-1702646,Feb. 7, 2017 (Feb. 7, 2017), XP051221499,total 13 pages.
Christopher Schnelling et al., "Construction of Polar Codes Exploiting Channel Transformation Structure", "IEEE Communications Letters", vol. 12, No. 19, Dec. 31, 2015 (Dec. 31, 2015), pp. 2058-2061.
Samsung,"Discussion on Flexible Polar Codes",3GPP TSG RAN WG1 #86,R1-166773, Gothenbourg, Sweden, Aug. 22-26, 2016,total 4 pages.

* cited by examiner

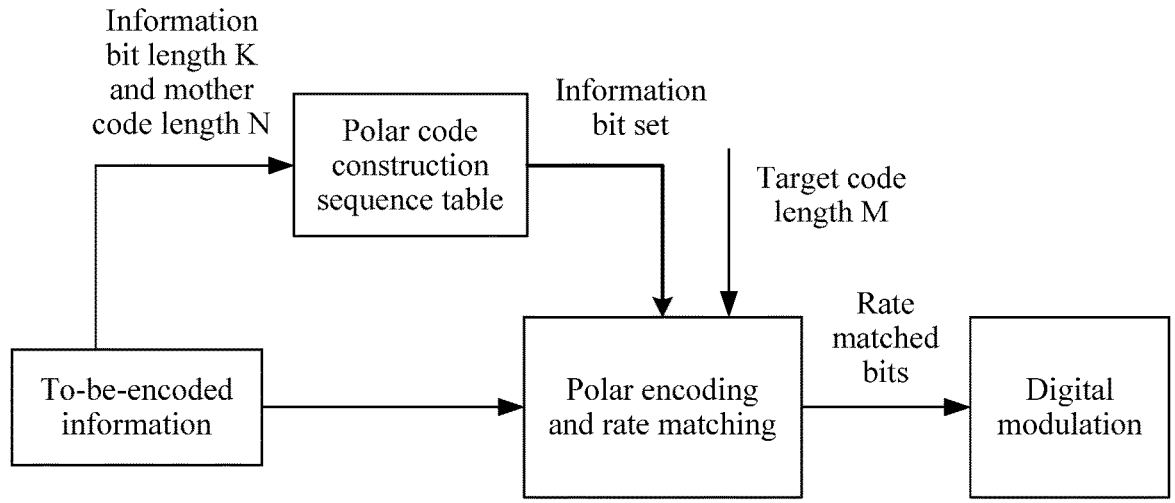

FIG. 2

Obtain an information bit set from a polar code construction sequence table based on an information bit length and a target code length of to-be-encoded information, where the polar code construction sequence table stores a mapping relationship between an encoding parameter and a construction sequence corresponding to the encoding parameter, the construction sequence is a sequence representing an order of reliability of polarized channels, and the encoding parameter includes at least one of an aggregation level, the target code length, and a mother code length, or the encoding parameter is a maximum mother code length ⟶ S101

Perform polarization encoding on the to-be-encoded information based on the to-be-encoded information and the information bit set ⟶ S102

FIG. 3

POLAR CODE ENCODING AND DECODING METHOD AND APPARATUS

CROSS-REFERENCE TO RELATED APPLICATIONS

This application is a continuation of International Application No. PCT/CN2018/085457, filed on May 3, 2018, which claims priority to Chinese Patent Application No. 201710302992.7, filed on May 3, 2017. The disclosures of the aforementioned patent applications are hereby incorporated by reference in their entireties.

TECHNICAL FIELD

This application relates to the field of communications technologies, and in particular, to a polar code encoding and decoding method and apparatus.

BACKGROUND

In a communications system, channel encoding is usually used to improve data transmission reliability and ensure communication quality. The 5th generation (5G) mobile communications technology requires that future channel encoding can support a wider range of code rates with relatively low complexity. A polar code is the first channel encoding method that can be strictly proved to "achieve" a channel capacity. The polar code is a linear block code, and has a generator matrix $G_N$ and an encoding process $x_1^N = u_1^N G_N$, where $u_1^N = (u_1, u_2, K, u_N)$ is a binary row vector with a length of N (in other words, a code length), $G_N = B_N F_2^{\otimes (\log_2(N))}$, $$F_2 = \begin{bmatrix} 1 & 0 \\ 1 & 1 \end{bmatrix},$$

$B_N$ is an N×N transposed matrix, for example, a transposed matrix in a bit reversal order, and $F_2^{\otimes (\log_2(N))}$ is defined as a Kronecker product of $\log_2 N$ matrices $F_2$.

In the encoding process of the polar code, some bits in $u_1^N$ are used to carry information, and are referred to as information bits, and a set of indexes of the information bits is denoted as A; and other bits in $u_1^N$ are set to constant values on which a transmit end and a receive end pre-agree, and are referred to as constant bits, and a set of indexes of the constant bits is represented by a complementary set $A^c$ of A. A constant bit is usually set to 0. Provided that the transmit end and the receive end make an agreement in advance, a constant bit sequence may be randomly set. A construction process of the polar code is a selection process of the set A, and determines performance of the polar code. The selection process of A is usually referred to as the construction process of the polar code. A relative order (an order sequence) or an order of relative sizes (a quantization sequence) of reliability of polarized channels may be obtained by constructing the polar code, and the obtained order sequence is referred to as a construction sequence. Finally, polarized channels having relatively high reliability may be selected for corresponding to the set A of indexes of information bits. The construction sequence may be determined through online calculation or through table storage.

In an existing table storage manner, in a polar code construction sequence table, a construction sequence is stored for each different information bit length or each different mother code length. Consequently, storage overheads are very high.

SUMMARY

Embodiments of this application provide a polar code encoding and decoding method and apparatus, to reduce storage overheads of a polar code construction sequence table.

According to a first aspect, an embodiment of this application provides a polar code encoding method, including: obtaining an information bit set from a polar code construction sequence table based on an information bit length and a target code length of to-be-encoded information, where the polar code construction sequence table stores a mapping relationship between an encoding parameter and a construction sequence corresponding to the encoding parameter, the construction sequence is a sequence representing an order of reliability of polarized channels, and the encoding parameter includes at least one of an aggregation level, the target code length, and a mother code length, or the encoding parameter is a maximum mother code length; and performing polarization encoding on the to-be-encoded information based on the to-be-encoded information and the information bit set. The polar code construction sequence table stores the mapping relationship between an encoding parameter and a construction sequence corresponding to the encoding parameter, and the encoding parameter includes at least one of the aggregation level, the target code length, and the mother code length, or the encoding parameter is the maximum mother code length. The construction sequence stored in this embodiment is unrelated to the information bit length, so that storage overheads of the polar code construction sequence table are much lower than those caused when a construction sequence is stored for each different information bit length and each different mother code length.

In one embodiment, the aggregation level represents a quantity of bits that can be carried on a control channel, and aggregation levels are in a one-to-one correspondence with target code lengths.

In one embodiment, the encoding parameter includes at least one of the aggregation level, the target code length, and the mother code length, and one construction sequence corresponding to one encoding parameter value is stored in the polar code construction sequence table.

Construction sequences are classified based on aggregation levels of a control channel of a polar code, and a limited quantity of construction sequences need to be stored, so that storage overheads can be reduced.

In one embodiment, the obtaining an information bit set from a polar code construction sequence table based on an information bit length and a target code length of to-be-encoded information includes: determining a corresponding first encoding parameter based on the target code length; obtaining, from the polar code construction sequence table, a first construction sequence corresponding to the first encoding parameter; and determining a first information bit set from the first construction sequence based on the information bit length.

In one embodiment, the encoding parameter includes at least one of the aggregation level, the target code length, and the mother code length; in the polar code construction sequence table, encoding parameter values less than or equal to a preset encoding parameter threshold correspond to a same second construction sequence, and one construction sequence corresponding to one encoding parameter value greater than the preset encoding parameter threshold is stored.

In one embodiment, the obtaining an information bit set from a polar code construction sequence table based on an information bit length and a target code length of to-be-encoded information includes: determining a corresponding second encoding parameter based on the target code length; and if the second encoding parameter is less than or equal to the encoding parameter threshold, selecting K information bits having highest reliability from the second construction sequence as the information bit set based on an information bit length K and the target code length, where K is a positive integer; or if the second encoding parameter is greater than the encoding parameter threshold, obtaining, from the polar code construction sequence table, a third construction sequence corresponding to the second encoding parameter; and determining the information bit set from the third construction sequence based on the information bit length.

In one embodiment, the encoding parameter is the maximum mother code length, and the polar code construction sequence table stores a third construction sequence corresponding to the maximum mother code length.

In one embodiment, the obtaining an information bit set from a polar code construction sequence table based on an information bit length and a target code length of to-be-encoded information includes: determining a mother code length N based on an information bit length K and the target code length, and selecting information bits corresponding to K polarized channels that have highest reliability and that are of N polarized channels from the third construction sequence as the information bit set, where N and K are positive integers.

In one embodiment, the construction sequence is a sequence obtained by sorting reliability or normalized reliability of polarized channels in ascending order or descending order or a sequence obtained by sorting error probabilities or normalized error probabilities of polarized channels in ascending order or descending order after the reliability of the polarized channels or the error probabilities of the polarized channels are calculated by using a Gaussion approximation method or a density evolution method.

In one embodiment, the construction sequence is a sequence obtained by sorting reliability or normalized reliability of polarized channels in ascending order or descending order after the reliability of the polarized channels is calculated based on polarized weights of the polarized channels.

According to a second aspect, an embodiment of this application provides a polar code encoding apparatus, including: an obtaining module, configured to obtain an information bit set from a polar code construction sequence table based on an information bit length and a target code length of to-be-encoded information, where the polar code construction sequence table stores a mapping relationship between an encoding parameter and a construction sequence corresponding to the encoding parameter, the construction sequence is a sequence representing an order of reliability of polarized channels, and the encoding parameter includes at least one of an aggregation level, the target code length, and a mother code length, or the encoding parameter is a maximum mother code length; and an encoding module, configured to perform polarization encoding on the to-be-encoded information based on the to-be-encoded information and the information bit set. The polar code construction sequence table stores the mapping relationship between an encoding parameter and a construction sequence corresponding to the encoding parameter, and the encoding parameter includes at least one of the aggregation level, the target code length, and the mother code length, or the encoding parameter is the maximum mother code length. The construction sequence stored in this embodiment is unrelated to the information bit length, so that storage overheads of the polar code construction sequence table are much lower than those caused when a construction sequence is stored for each different information bit length and each different mother code length.

In one embodiment, the aggregation level represents a quantity of bits that can be carried on a control channel, and aggregation levels are in a one-to-one correspondence with target code lengths.

In one embodiment, the encoding parameter includes at least one of the aggregation level, the target code length, and the mother code length, and one construction sequence corresponding to one encoding parameter value is stored in the polar code construction sequence table.

In one embodiment, the obtaining module is configured to: determine a corresponding first encoding parameter based on the target code length; obtain, from the polar code construction sequence table, a first construction sequence corresponding to the first encoding parameter; and determine a first information bit set from the first construction sequence based on the information bit length.

In one embodiment, the encoding parameter includes at least one of the aggregation level, the target code length, and the mother code length; in the polar code construction sequence table, encoding parameter values less than or equal to a preset encoding parameter threshold correspond to a same second construction sequence, and one construction sequence corresponding to one encoding parameter value greater than the preset encoding parameter threshold is stored.

In one embodiment, the obtaining module is configured to: determine a corresponding second encoding parameter based on the target code length; and if the second encoding parameter is less than or equal to the encoding parameter threshold, select K information bits having highest reliability from the second construction sequence as the information bit set based on an information bit length K and the target code length, where K is a positive integer; or if the second encoding parameter is greater than the encoding parameter threshold, obtain, from the polar code construction sequence table, a third construction sequence corresponding to the second encoding parameter; and determine the information bit set from the third construction sequence based on the information bit length.

In one embodiment, the encoding parameter is the maximum mother code length, and the polar code construction sequence table stores a third construction sequence corresponding to the maximum mother code length.

In one embodiment, the obtaining module is configured to: determine a mother code length N based on an information bit length K and the target code length, and select information bits corresponding to K polarized channels that have highest reliability and that are of N polarized channels from the third construction sequence as the information bit set, where N and K are positive integers.

In one embodiment, the construction sequence is a sequence obtained by sorting reliability or normalized reliability of polarized channels in ascending order or descending order or a sequence obtained by sorting error probabilities or normalized error probabilities of polarized channels in ascending order or descending order after the reliability of the polarized channels or the error probabilities of the polarized channels are calculated by using a Gaussion approximation method or a density evolution method.

In one embodiment, the construction sequence is a sequence obtained by sorting reliability or normalized reliability of polarized channels in ascending order or descending order after the reliability of the polarized channels is calculated based on polarized weights of the polarized channels.

According to a third aspect, an embodiment of this application provides a polar code encoding apparatus, including:

a memory and a processor, where the memory is configured to store a program instruction; and the processor is configured to:

obtain an information bit set from a polar code construction sequence table based on an information bit length and a target code length of to-be-encoded information, where the polar code construction sequence table stores a mapping relationship between an encoding parameter and a construction sequence corresponding to the encoding parameter, the construction sequence is a sequence representing an order of reliability of polarized channels, and the encoding parameter includes at least one of the aggregation level, the target code length, and the mother code length, or the encoding parameter is a maximum mother code length; and perform polarization encoding on the to-be-encoded information based on the to-be-encoded information and the information bit set. The polar code construction sequence table stores the mapping relationship between an encoding parameter and a construction sequence corresponding to the encoding parameter, and the encoding parameter includes at least one of the aggregation level, the target code length, and the mother code length, or the encoding parameter is the maximum mother code length. The construction sequence stored in this embodiment is unrelated to the information bit length, so that storage overheads of the polar code construction sequence table are much lower than those caused when a construction sequence is stored for each different information bit length and each different mother code length.

In one embodiment, the aggregation level represents a quantity of bits that can be carried on a control channel, and aggregation levels are in a one-to-one correspondence with target code lengths.

In one embodiment, the encoding parameter includes at least one of the aggregation level, the target code length, and the mother code length, and one construction sequence corresponding to one encoding parameter value is stored in the polar code construction sequence table.

In one embodiment, the processor is configured to: determine a corresponding first encoding parameter based on the target code length; obtain, from the polar code construction sequence table, a first construction sequence corresponding to the first encoding parameter; and determine a first information bit set from the first construction sequence based on the information bit length.

In one embodiment, the encoding parameter includes at least one of the aggregation level, the target code length, and the mother code length; in the polar code construction sequence table, encoding parameter values less than or equal to a preset encoding parameter threshold correspond to a same second construction sequence, and one construction sequence corresponding to one encoding parameter value greater than the preset encoding parameter threshold is stored.

In one embodiment, the processor is configured to: determine a corresponding second encoding parameter based on the target code length; and if the second encoding parameter is less than or equal to the encoding parameter threshold, select K information bits having highest reliability from the second construction sequence as the information bit set based on an information bit length K and the target code length, where K is a positive integer; or if the second encoding parameter is greater than the encoding parameter threshold, obtain, from the polar code construction sequence table, a third construction sequence corresponding to the second encoding parameter; and determine the information bit set from the third construction sequence based on the information bit length.

In one embodiment, the encoding parameter is the maximum mother code length, and the polar code construction sequence table stores a third construction sequence corresponding to the maximum mother code length.

In one embodiment, the processor is configured to: determine a mother code length N based on an information bit length K and the target code length, and select information bits corresponding to K polarized channels that have highest reliability and that are of N polarized channels from the third construction sequence as the information bit set, where N and K are positive integers.

In one embodiment, the construction sequence is a sequence obtained by sorting reliability or normalized reliability of polarized channels in ascending order or descending order or a sequence obtained by sorting error probabilities or normalized error probabilities of polarized channels in ascending order or descending order after the reliability of the polarized channels or the error probabilities of the polarized channels are calculated by using a Gaussion approximation method or a density evolution method.

In one embodiment, the construction sequence is a sequence obtained by sorting reliability or normalized reliability of polarized channels in ascending order or descending order after the reliability of the polarized channels is calculated based on polarized weights of the polarized channels.

According to a fourth aspect, an embodiment of this application provides a polar code decoding method, including: obtaining an information bit set from a polar code construction sequence table based on an information bit length and a target code length of to-be-decoded information, where the polar code construction sequence table stores a mapping relationship between an encoding parameter and a construction sequence corresponding to the encoding parameter, the construction sequence is a sequence representing an order of reliability of polarized channels, and the encoding parameter includes at least one of an aggregation level, the target code length, and a mother code length, or the encoding parameter is a maximum mother code length; and decoding the to-be-decoded information based on the to-be-decoded information and the information bit set. The polar code construction sequence table stores the mapping relationship between an encoding parameter and a construction sequence corresponding to the encoding parameter, and the encoding parameter includes at least one of the aggregation level, the target code length, and the mother code length, or the encoding parameter is the maximum mother code length. The construction sequence stored in this embodiment is unrelated to the information bit length, so that storage overheads of the polar code construction sequence table are much lower than those caused when a construction sequence is stored for each different information bit length and each different mother code length.

In one embodiment, the aggregation level represents a quantity of bits that can be carried on a control channel, and aggregation levels are in a one-to-one correspondence with target code lengths.

In one embodiment, the encoding parameter includes at least one of the aggregation level, the target code length, and the mother code length, and one construction sequence corresponding to one encoding parameter value is stored in the polar code construction sequence table.

In one embodiment, the obtaining an information bit set from a polar code construction sequence table based on an information bit length and a target code length of to-be-decoded information includes: determining a corresponding first encoding parameter based on the target code length; obtaining, from the polar code construction sequence table, a first construction sequence corresponding to the first encoding parameter; and determining a first information bit set from the first construction sequence based on the information bit length.

In one embodiment, the encoding parameter includes at least one of the aggregation level, the target code length, and the mother code length; in the polar code construction sequence table, encoding parameter values less than or equal to a preset encoding parameter threshold correspond to a same second construction sequence, and one construction sequence corresponding to one encoding parameter value greater than the preset encoding parameter threshold is stored.

In one embodiment, the obtaining an information bit set from a polar code construction sequence table based on an information bit length and a target code length of to-be-decoded information includes: determining a corresponding second encoding parameter based on the target code length; and if the second encoding parameter is less than or equal to the encoding parameter threshold, selecting K information bits having highest reliability from the second construction sequence as the information bit set based on an information bit length K and the target code length, where K is a positive integer; or if the second encoding parameter is greater than the encoding parameter threshold, obtaining, from the polar code construction sequence table, a third construction sequence corresponding to the second encoding parameter; and determining the information bit set from the third construction sequence based on the information bit length.

In one embodiment, the encoding parameter is the maximum mother code length, and the polar code construction sequence table stores a third construction sequence corresponding to the maximum mother code length.

In one embodiment, the obtaining an information bit set from a polar code construction sequence table based on an information bit length and a target code length of to-be-decoded information includes: determining a mother code length N based on an information bit length K and the target code length, and selecting information bits corresponding to K polarized channels that have highest reliability and that are of N polarized channels from the third construction sequence as the information bit set, where N and K are positive integers.

In one embodiment, the construction sequence is a sequence obtained by sorting reliability or normalized reliability of polarized channels in ascending order or descending order or a sequence obtained by sorting error probabilities or normalized error probabilities of polarized channels in ascending order or descending order after the reliability of the polarized channels or the error probabilities of the polarized channels are calculated by using a Gaussion approximation method or a density evolution method.

In one embodiment, the construction sequence is a sequence obtained by sorting reliability or normalized reliability of polarized channels in ascending order or descending order after the reliability of the polarized channels is calculated based on polarized weights of the polarized channels.

According to a fifth aspect, an embodiment of this application provides a polar code decoding apparatus, including:

an obtaining module, configured to obtain an information bit set from a polar code construction sequence table based on an information bit length and a target code length of to-be-decoded information, where the polar code construction sequence table stores a mapping relationship between an encoding parameter and a construction sequence corresponding to the encoding parameter, the construction sequence is a sequence representing an order of reliability of polarized channels, and the encoding parameter includes at least one of an aggregation level, the target code length, and a mother code length, or the encoding parameter is a maximum mother code length; and a decoding module, configured to decode the to-be-decoded information based on the to-be-decoded information and the information bit set. The polar code construction sequence table stores the mapping relationship between an encoding parameter and a construction sequence corresponding to the encoding parameter, and the encoding parameter includes at least one of the aggregation level, the target code length, and the mother code length, or the encoding parameter is the maximum mother code length. The construction sequence stored in this embodiment is unrelated to the information bit length, so that storage overheads of the polar code construction sequence table are much lower than those caused when a construction sequence is stored for each different information bit length and each different mother code length.

In one embodiment, the encoding parameter includes at least one of the aggregation level, the target code length, and the mother code length, and one construction sequence corresponding to one encoding parameter value is stored in the polar code construction sequence table.

In one embodiment, the obtaining module is configured to: determine a corresponding first encoding parameter based on the target code length; obtain, from the polar code construction sequence table, a first construction sequence corresponding to the first encoding parameter; and determine a first information bit set from the first construction sequence based on the information bit length.

In one embodiment, the encoding parameter includes at least one of the aggregation level, the target code length, and the mother code length; in the polar code construction sequence table, encoding parameter values less than or equal to a preset encoding parameter threshold correspond to a same second construction sequence, and one construction sequence corresponding to one encoding parameter value greater than the preset encoding parameter threshold is stored.

In one embodiment, the obtaining module is configured to: determine a corresponding second encoding parameter based on the target code length; and if the second encoding parameter is less than or equal to the encoding parameter threshold, select K information bits having highest reliability from the second construction sequence as the information bit set based on an information bit length K and the target code length, where K is a positive integer; or if the second encoding parameter is greater than the encoding parameter threshold, obtain, from the polar code construction sequence table, a third construction sequence corresponding to the second encoding parameter; and determine the information bit set from the third construction sequence based on the information bit length.

In one embodiment, the encoding parameter is the maximum mother code length, and the polar code construction sequence table stores a third construction sequence corresponding to the maximum mother code length.

In one embodiment, the obtaining module is configured to: determine a mother code length N based on an information bit length K and the target code length, and select information bits corresponding to K polarized channels that have highest reliability and that are of N polarized channels from the third construction sequence as the information bit set, where N and K are positive integers.

In one embodiment, the construction sequence is a sequence obtained by sorting reliability or normalized reliability of polarized channels in ascending order or descending order or a sequence obtained by sorting error probabilities or normalized error probabilities of polarized channels in ascending order or descending order after the reliability of the polarized channels or the error probabilities of the polarized channels are calculated by using a Gaussion approximation method or a density evolution method.

In one embodiment, the construction sequence is a sequence obtained by sorting reliability or normalized reliability of polarized channels in ascending order or descending order after the reliability of the polarized channels is calculated based on polarized weights of the polarized channels.

According to a sixth aspect, an embodiment of this application provides a polar code decoding apparatus, including:

a memory and a processor, where the memory is configured to store a program instruction; and the processor is configured to:

obtain an information bit set from a polar code construction sequence table based on an information bit length and a target code length of to-be-decoded information, where the polar code construction sequence table stores a mapping relationship between an encoding parameter and a construction sequence corresponding to the encoding parameter, the construction sequence is a sequence representing an order of reliability of polarized channels, and the encoding parameter includes at least one of an aggregation level, the target code length, and a mother code length, or the encoding parameter is a maximum mother code length; and decode the to-be-decoded information based on the to-be-decoded information and the information bit set. The polar code construction sequence table stores the mapping relationship between an encoding parameter and a construction sequence corresponding to the encoding parameter, and the encoding parameter includes at least one of the aggregation level, the target code length, and the mother code length, or the encoding parameter is the maximum mother code length. The construction sequence stored in this embodiment is unrelated to the information bit length, so that storage overheads of the polar code construction sequence table are much lower than those caused when a construction sequence is stored for each different information bit length and each different mother code length.

In one embodiment, the encoding parameter includes at least one of the aggregation level, the target code length, and the mother code length, and one construction sequence corresponding to one encoding parameter value is stored in the polar code construction sequence table.

In one embodiment, the processor is configured to: determine a corresponding first encoding parameter based on the target code length; obtain, from the polar code construction sequence table, a first construction sequence corresponding to the first encoding parameter; and determine a first information bit set from the first construction sequence based on the information bit length.

In one embodiment, the encoding parameter includes at least one of the aggregation level, the target code length, and the mother code length; in the polar code construction sequence table, encoding parameter values less than or equal to a preset encoding parameter threshold correspond to a same second construction sequence, and one construction sequence corresponding to one encoding parameter value greater than the preset encoding parameter threshold is stored.

In one embodiment, the processor is configured to: determine a corresponding second encoding parameter based on the target code length; and if the second encoding parameter is less than or equal to the encoding parameter threshold, select K information bits having highest reliability from the second construction sequence as the information bit set based on an information bit length K and the target code length, where K is a positive integer; or if the second encoding parameter is greater than the encoding parameter threshold, obtain, from the polar code construction sequence table, a third construction sequence corresponding to the second encoding parameter; and determine the information bit set from the third construction sequence based on the information bit length.

In one embodiment, the construction sequence is a sequence obtained by sorting reliability or normalized reliability of polarized channels in ascending order or descending order or a sequence obtained by sorting error probabilities or normalized error probabilities of polarized channels in ascending order or descending order after the reliability of the polarized channels or the error probabilities of the polarized channels are calculated by using a Gaussion approximation method or a density evolution method.

In one embodiment, the construction sequence is a sequence obtained by sorting reliability or normalized reliability of polarized channels in ascending order or descending order after the reliability of the polarized channels is calculated based on polarized weights of the polarized channels.

According to a seventh aspect, an embodiment of this application provides a readable storage medium. The readable storage medium stores an executable instruction. When at least one processor of an encoding apparatus executes the executable instruction, the encoding apparatus performs the encoding method in any one of the first aspect or the embodiments of the first aspect.

According to an eighth aspect, an embodiment of this application provides a readable storage medium. The readable storage medium stores an executable instruction. When at least one processor of a decoding apparatus executes the executable instruction, the decoding apparatus performs the decoding method in any one of the fourth aspect or the embodiments of the fourth aspect.

According to a ninth aspect, an embodiment of this application provides a program product. The program product includes an executable instruction, and the executable instruction is stored in a readable storage medium. At least one processor of an encoding apparatus may read the executable instruction from the readable storage medium, and the at least one processor executes the executable instruction, so that the encoding apparatus performs the encoding method in any one of the first aspect or the embodiments of the first aspect.

According to a tenth aspect, an embodiment of this application provides a program product. The program product includes an executable instruction, and the executable instruction is stored in a readable storage medium. At least one processor of a decoding apparatus may read the executable instruction from the readable storage medium, and the at least one processor executes the executable instruction, so that the decoding apparatus performs the decoding method in any one of the fourth aspect or the embodiments of the fourth aspect.

BRIEF DESCRIPTION OF DRAWINGS

FIG. 2 is a schematic diagram of a polar code encoding process;

FIG. 3 is a flowchart of an embodiment of a polar code encoding method according to the embodiments of this application;

DESCRIPTION OF EMBODIMENTS

In the embodiments of this application, in a 5G communications scenario, a channel encoding technology used to improve information transmission reliability and ensure communication quality may be applied to a scenario in which polar encoding and decoding are performed on information. For example, the channel encoding technology may be applied to a scenario in which polar encoding and decoding are performed on uplink control information and downlink control information in enhanced mobile broadband (eMBB), or may be applied to other scenarios, for example, applied to channel encoding (Channel Coding) in 5.1.3 of the communications standard TS 36.212, and channel encoding of uplink control information, downlink control information, and a sidelink channel. This is not limited in the embodiments of this application.

Figure 1:
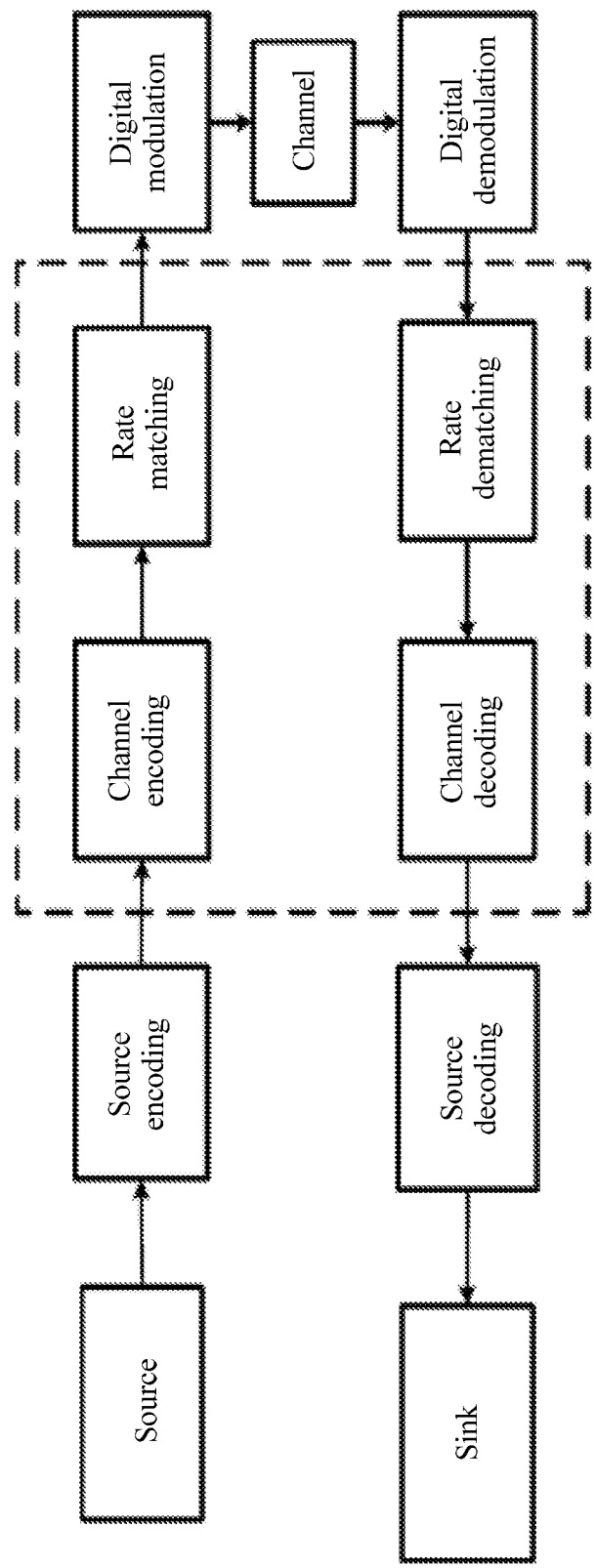
FIG. 1 is a schematic flowchart of a communications system.

FIG. 1 is a schematic flowchart of a communications system. A structure of channel encoding in the communications system is shown in FIG. 1. During information transmission, after source encoding, channel encoding, and rate matching are performed on to-be-sent information (source) at a transmit end, to obtain encoded bits, and the encoded bits are sent through a channel after digital modulation. After digital demodulation is performed on to-be-decoded information at a receive end, to obtain a to-be-decoded sequence, and then rate dematching, channel decoding, and source decoding are performed on the to-be-decoded sequence, to obtain decoded information (sink). The channel encoding and the rate matching play a vital role in information transmission reliability in the entire communications system.

FIG. 2 is a schematic diagram of a polar code encoding process. A polar code is encoded by a transmit end. As shown in FIG. 2, the polar code encoding process includes three processing processes: construction, encoding, and rate matching. Before the polar code is encoded, an information bit set is first obtained from a polar code construction sequence table based on an information bit length K and a mother code length N of input to-be-encoded information. After the information bit set is obtained, polarization encoding is performed on the to-be-encoded information based on the to-be-encoded information and the information bit set, to obtain encoded bits. Finally rate matching is performed based on a target code length M, to obtain rate-matched bits. After digital modulation is performed on the rate-matched bits, the bits are sent through a channel. In a polar code construction sequence table in a related technology, a construction sequence is stored for each different information bit length and each different mother code length, and consequently, storage overheads are very high. To resolve this problem, an embodiment of this application provides a storage manner of a polar code construction sequence table, to reduce storage overheads. A polar code encoding and decoding method and apparatus provided in the embodiments of this application are described below in detail with reference to the accompanying drawings.

The embodiments of this application are mainly applied to various wireless communications systems. Network elements used in the embodiments of this application are related to a base station and a terminal device, and may implement communication between the base station and the terminal device. The technical solutions of the embodiments of this application may be applied to a 5G communications system, and may also be applied to various other communications systems, such as a global system for mobile communications (GSM) system, a code division multiple access (CDMA) system, a wideband code division multiple access (WCDMA) system, a general packet radio service (GPRS) system, a long term evolution (LTE) system, an LTE frequency division duplex (FDD) system, an LTE time division duplex (TDD) system, a universal mobile telecommunications system (UMTS).

FIG. 3 is a flowchart of an embodiment of a polar code encoding method according to the embodiments of this application. As shown in FIG. 3, this embodiment is described by using a transmit end as an execution body. The method in this embodiment may include the following operations.

S101: Obtain an information bit set from a polar code construction sequence table based on an information bit length and a target code length of to-be-encoded information, where the polar code construction sequence table stores a mapping relationship between an encoding parameter and a construction sequence corresponding to the encoding parameter, the construction sequence is a sequence representing an order of reliability of polarized channels, and the encoding parameter includes at least one of an aggregation level, the target code length, and a mother code length, or the encoding parameter is a maximum mother code length.

S102: Perform polarization encoding on the to-be-encoded information based on the to-be-encoded information and the information bit set. In one embodiment, the to-be-encoded information may be mapped to polarized channels corresponding to the information bit set, and a bit corresponding to a remaining polarized channel is set to a constant value for polar encoding.

In the polar code encoding method provided in this embodiment, the polar code construction sequence table stores the mapping relationship between an encoding parameter and a construction sequence corresponding to the encoding parameter, and the encoding parameter includes at least one of the aggregation level, the target code length, and the mother code length, or the encoding parameter is the maximum mother code length. The construction sequence stored in this embodiment is unrelated to the information bit length, so that storage overheads of the polar code construction sequence table are much lower than those caused when a construction sequence is stored for each different information bit length and each different mother code length.

In this embodiment of this application, the mother code length is a code length used when polar encoding is performed, and the target code length is a length M of a bit sequence obtained after encoding and rate matching. The aggregation level represents a quantity of bits that can be carried on a control channel, and a higher aggregation level indicates a larger quantity of bits that can be carried. Usually, aggregation levels are in a one-to-one correspondence with target code lengths. One aggregation level corresponds to one target code length. With a same quantity of information bits, a higher aggregation level indicates a longer code length and a lower code rate. For example, four aggregation levels 1 to 4 are specified in a communications system, and corresponding target code lengths are 72, 144, 288, and 576 respectively. Assuming that a length of the to-be-encoded information is 80, a target code length corresponding to any one of the aggregation levels 2 to 4 may be used for transmission.

In this embodiment of this application, the construction sequence is a sequence representing an order of reliability of polarized channels. When the encoding parameter includes at least one of the aggregation level, the target code length, and the mother code length, the construction sequence is a sequence obtained by sorting reliability or normalized reliability of polarized channels in ascending order or descending order or a sequence obtained by sorting error probabilities or normalized error probabilities of polarized channels in ascending order or descending order after the reliability of the polarized channels or the error probabilities of the polarized channels are calculated by using a Gaussion approximation method or a density evolution method. In a feasible manner, one construction sequence corresponding to one encoding parameter value is stored in the polar code construction sequence table. In this case, the obtaining an information bit set from a polar code construction sequence table based on an information bit length and a target code length of to-be-encoded information may include: determining a corresponding first encoding parameter based on the target code length; obtaining, from the polar code construction sequence table, a first construction sequence corresponding to the first encoding parameter; and determining a first information bit set from the first construction sequence based on the information bit length.

In another feasible manner, in the polar code construction sequence table, a same construction sequence (a second construction sequence) corresponding to encoding parameter values less than or equal to a preset encoding parameter threshold may be stored, and one construction sequence corresponding to one encoding parameter value greater than the preset encoding parameter threshold is stored. In this case, the obtaining an information bit set from a polar code construction sequence table based on an information bit length and a target code length of to-be-encoded information may include: determining a corresponding second encoding parameter based on the target code length; and if the second encoding parameter is less than or equal to the encoding parameter threshold, selecting K information bits having highest reliability from the second construction sequence as the information bit set based on an information bit length K and the target code length, where K is a positive integer; or if the second encoding parameter is greater than the encoding parameter threshold, obtaining, from the polar code construction sequence table, a third construction sequence corresponding to the second encoding parameter; and determining the information bit set from the third construction sequence based on the information bit length.

When the encoding parameter is the maximum mother code length, the construction sequence is a sequence obtained by sorting reliability or normalized reliability of polarized channels in ascending order or descending order after the reliability of the polarized channels is calculated based on polarized weights of the polarized channels. The polar code construction sequence table stores the third construction sequence corresponding to the maximum mother code length. In this case, the obtaining an information bit set from a polar code construction sequence table based on an information bit length and a target code length of to-be-encoded information may include: determining a mother code length N based on an information bit length K and the target code length, and selecting information bits corresponding to K polarized channels that have highest reliability and that are of N polarized channels from the third construction sequence as the information bit set, where N and K are positive integers.

The polar code construction sequence table may store the following five types of content.

1. The polar code construction sequence table stores a mapping relationship between an aggregation level and a construction sequence corresponding to the aggregation level.

In the manner, the polar code construction sequence table may be divided based on the aggregation level, and at a same aggregation level, a construction sequence is shared for different information bit lengths. A quantity of aggregation levels is usually limited. For example, for a control channel in long term evolution (LTE), there are four aggregation levels based on a size of a resource block, and performing storage based on the aggregation levels does not excessively increase complexity. If there are L aggregation levels, there are L stored construction sequences, and the aggregation levels are in a one-to-one correspondence with the construction sequences, as shown in Table 1. Content and a form of the construction sequence are not limited. For example, the construction sequence may be a sequence obtained by sorting reliability or normalized reliability of polarized channels in ascending order or descending order, or a sequence obtained by sorting error probabilities or normalized error probabilities of polarized channels in ascending order or descending order.

TABLE 1

| Polar code construction sequence table in which storage is performed based on aggregation levels ||
| --- | --- |
| Aggregation level | Construction sequence |
| 1 | Construction sequence 1 |
| 2 | Construction sequence 2 |
| 3 | Construction sequence 3 |
| ... | ... |
| L | Construction sequence L |

The transmit end obtains the information bit set from the polar code construction sequence table based on the information bit length and the target code length of the to-be-encoded information. Because one aggregation level corresponds to one target code length, a corresponding aggregation level may be first determined based on a target code length, a construction sequence corresponding to the aggregation level is obtained from the polar code construction sequence table shown in Table 1, and after the construction sequence is determined, an information bit set is determined from the construction sequence based on an information bit length of to-be-encoded information. For example, if the information bit length of the to-be-encoded information is K, and the construction sequence is a sequence obtained by sorting reliability or normalized reliability of polarized channels in ascending order, last K bits (having relatively high reliability) are selected from the construction sequence as the information bit set. Construction sequences are classified based on aggregation levels of a control channel of a polar code, and a limited quantity of construction sequences need to be stored, so that storage overheads can be reduced.

2. The polar code construction sequence table stores a mapping relationship between a target code length and a construction sequence corresponding to the target code length.

Table 2 is a corresponding polar code construction sequence table designed based on target code lengths corresponding to one or more aggregation levels. With a same target code length, one sequence is shared for different information bit lengths. Different target code lengths may be in a multiple relationship, or may increase in a linear or non-linear manner and may be in a one-to-one correspondence with aggregation levels. For example, M is a code length corresponding to an aggregation level 1, and Kn×M is a code length corresponding to an aggregation level n. In the manner, division is performed based on a target code length in a more flexible manner. For example, in some cases, control information may be transmitted through a data channel by using a specified target code length, and a concept of an aggregation level is not used. For another example, one aggregation level includes a plurality of target code lengths, and therefore, one aggregation level is not used to indicate construction sequences with different target code lengths. Target code lengths are not necessarily in a one-to-one correspondence with aggregation levels. Table 2 shows target code lengths that may be set based on an actual application requirement and corresponding construction sequences.

TABLE 2

Polar code construction sequence table in which storage is performed based on target code lengths

| Target code length | Construction sequence |
| --- | --- |
| M | Construction sequence 1 |
| K1 × M | Construction sequence 2 |
| K2 × M | Construction sequence 3 |
| ... | ... |
| Kn × M | Construction sequence n |

The obtaining, by the transmit end, the information bit set from the polar code construction sequence table based on the information bit length and the target code length of the to-be-encoded information includes: first obtaining, from the polar code construction sequence table shown in Table 2, the construction sequence corresponding to the target code length, and determining an information bit set from the construction sequence based on the information bit length of the to-be-encoded information after the construction sequence is determined. For example, if the information bit length of the to-be-encoded information is K, and the construction sequence is a sequence obtained by sorting reliability or normalized reliability of polarized channels in descending order, first K bits are selected from the construction sequence as the information bit set.

In one embodiment, in the polar code construction sequence table, a same construction sequence (a second construction sequence) corresponding to encoding parameter values less than or equal to a preset encoding parameter threshold may be stored, and one construction sequence corresponding to one encoding parameter value greater than the preset encoding parameter threshold is stored. In other words, one construction sequence corresponding to the encoding parameter values less than or equal to the preset encoding parameter threshold may be stored, as shown in Table 3. Table 3 is a polar code construction sequence table in which storage is performed based on target code lengths or aggregation levels. A same construction sequence corresponding to target code lengths less than 12 is stored, and one construction sequence corresponding to a target code length 24, 48, or the like is stored. For example, the construction sequence is a sequence obtained by sorting reliability of polarized channels in ascending order. The target code length is used as an example. The obtaining, by the transmit end, the information bit set from the polar code construction sequence table based on the information bit length and the target code length of the to-be-encoded information includes: if the target code length of the to-be-encoded information is equal to 12, and the information bit length of the to-be-encoded information is 6, selecting six information bits (13, 8, 12, 14, 15, 16) having highest reliability from a construction sequence (1, 2, 3, 5, 9, 4, 6, 7, 10, 11, 13, 8, 12, 14, 15, 16) as the information bit set based on the information bit length 6 and the target code length 12; or if the target code length of the to-be-encoded information is equal to 8, and the information bit length of the to-be-encoded information is 4, selecting four information bits (4, 6, 7, 8) having highest reliability from a construction sequence (1, 2, 3, 5, 4, 6, 7, 8) as the information bit set based on the information bit length 4 and the target code length 8.

TABLE 3

Polar code construction sequence table in which storage is performed based on target code lengths or aggregation levels

| Target code length or aggregation level | Construction sequence |
| --- | --- |
| 12 | 1, 2, 3, 5, 9, 4, 6, 7, 10, 11, 13, 8, 12, 14, 15, 16 |
| 24 | 1, 2, 3, 5, 9, 17, 4, 6, 7, 10, 11, 18, 13, 19, 21, 8, 25, 12, 14, 20, 15, 22, 23, 26, 27, 29, 16, 24, 28, 30, 31, 32 |
| 48 | 1, 2, 3, 5, 9, 17, 4, 33, 6, 7, 10, 11, 18, 13, 19, 34, 21, 35, 8, 25, 37, 12, 41, 14, 20, 15, 49, 22, 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64 |
| ... | ... |

If the target code length of the to-be-encoded information is greater than 12, for example, 24, the construction sequence (1, 2, 3, 5, 9, 17, 4, 6, 7, 10, 11, 18, 13, 19, 21, 8, 25, 12, 14, 20, 15, 22, 23, 26, 27, 29, 16, 24, 28, 30, 31, 32) corresponding to the target code length 24 is obtained from the polar code construction sequence table, and the information bit set is determined from the construction sequence based on the information bit length.

3. The polar code construction sequence table stores a mapping relationship between an aggregation level, a target code length, and a construction sequence.

In this embodiment, the mapping relationship between an aggregation level and a target code length and a construction sequence corresponding to the aggregation level and the target code length may be stored. Table 4 is a polar code construction sequence table storing the mapping relationship between an aggregation level, a target code length, and a construction sequence. As shown in Table 4, target code lengths and aggregation levels are in a one-to-one correspondence with construction sequences.

TABLE 4

Polar code construction sequence table in which storage is performed based on target code lengths and aggregation levels

| Target code length and aggregation level | Construction sequence |
|---|---|
| 3/1 | 1, 2, 3, 4 |
| 6/2 | 1, 2, 3, 5, 4, 6, 7, 8 |
| 12/3 | 1, 2, 3, 5, 9, 4, 6, 7, 10, 11, 13, 8, 12, 14, 15, 16 |
| . . . | . . . |

In this embodiment, the construction sequence may be determined based on the target code length or the aggregation level. A manner in which the transmit end obtains the information bit set from the polar code construction sequence table based on the information bit length and the target code length of the to-be-encoded information is the same as that shown in Table 1 or Table 2. Details are not described herein again.

Table 5 is another polar code construction sequence table storing a mapping relationship between an aggregation level, a target code length, and a construction sequence. As shown in Table 5, one construction sequence corresponding to encoding parameters in which a target code length is less than or equal to 12 and an aggregation level is less than or equal to 3 is stored, one construction sequence corresponding to each encoding parameter in which a target code length is greater than 12 and an aggregation level is greater than 3 is stored. For example, the construction sequence is a sequence obtained by sorting reliability of polarized channels in ascending order. The construction sequence may be determined based on the target code length or the aggregation level. A manner in which the transmit end obtains the information bit set from the polar code construction sequence table based on the information bit length and the target code length of the to-be-encoded information is the same as that shown in Table 3. Details are not described herein again.

TABLE 5

Polar code construction sequence table in which storage is performed based on target code lengths and aggregation levels

| Target code length and aggregation level | Construction sequence |
|---|---|
| 12/(1, 2, 3) | 1, 2, 3, 5, 9, 4, 6, 7, 10, 11, 13, 8, 12, 14, 15, 16 |
| 24/3 | 1, 2, 3, 5, 9, 17, 4, 6, 7, 10, 11, 18, 13, 19, 21, 8, 25, 12, 14, 20, 15, 22, 23, 26, 27, 29, 16, 24, 28, 30, 31, 32 |
| 48/4 | 1, 2, 3, 5, 9, 17, 4, 33, 6, 7, 10, 11, 18, 13, 19, 34, 21, 35, 8, 25, 37, 12, 41, 14, 20, 15, 49, 22, |

TABLE 5-continued

Polar code construction sequence table in which storage is performed based on target code lengths and aggregation levels

| Target code length and aggregation level | Construction sequence |
|---|---|
| | 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64 |
| . . . | . . . |

4. The polar code construction sequence table stores a mapping relationship between a mother code length and a construction sequence corresponding to the mother code length.

In this embodiment, the mapping relationship between a mother code length and a construction sequence corresponding to the mother code length may be stored. As shown in Table 6, one construction sequence corresponding to one mother code length is stored. The construction sequence may be a sequence obtained by sorting reliability or normalized reliability of polarized channels in ascending order or descending order, or a sequence obtained by sorting error probabilities or normalized error probabilities of polarized channels in ascending order or descending order. A manner in which the transmit end obtains the information bit set from the polar code construction sequence table based on the information bit length and the target code length of the to-be-encoded information is the same as that shown in Table 1 or Table 2. Details are not described herein again.

TABLE 6

Polar code construction sequence table in which storage is performed based on mother code lengths

| Mother code length | Construction sequence |
|---|---|
| 4 | 1, 2, 3, 4 |
| 8 | 1, 2, 3, 5, 4, 6, 7, 8 |
| 16 | 1, 2, 3, 5, 9, 4, 6, 7, 10, 11, 13, 8, 12, 14, 15, 16 |
| . . . | . . . |
| 1024 | . . . |

As shown in Table 7, Table 7 stores a mapping relationship between a mother code length and a construction sequence corresponding to the mother code length. A construction sequence corresponding to each of mother code lengths 32 and 64 is stored. A construction sequence corresponding to each of a mother code length less than 32 and a mother code length greater than or equal to 64 is stored. For example, the construction sequence is a sequence obtained by sorting reliability of polarized channels in ascending order. A manner in which the transmit end obtains the information bit set from the polar code construction sequence table based on the information bit length and the target code length of the to-be-encoded information is the same as that shown in Table 3. Details are not described herein again.

TABLE 7

Polar code construction sequence table in which storage is performed based on mother code lengths

| Mother code length | Construction sequence |
|---|---|
| 4 | 1, 2, 3, 4 |
| 16 | 1, 2, 3, 5, 9, 4, 6, 7, 10, 11, 13, 8, 12, 14, 15, 16 |

TABLE 7-continued

Polar code construction sequence table in which
storage is performed based on mother code lengths

| Mother code length | Construction sequence |
|---|---|
| 64 | 1, 2, 3, 5, 9, 17, 4, 33, 6, 7, 10, 11, 18, 13, 19, 34, 21, 35, 8, 25, 37, 12, 41, 14, 20, 15, 49, 22, 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64 |
| ... | ... |
| 1024 | ... |

5. The polar code construction sequence table stores a mapping relationship between a maximum mother code length and a construction sequence corresponding to the maximum mother code length. The maximum mother code length is a maximum mother code length that can be supported according to an agreement in the communications system.

In this embodiment, the mapping relationship between a maximum mother code length and a construction sequence corresponding to the maximum mother code length is stored. The construction sequence is a sequence obtained by sorting reliability or normalized reliability of polarized channels in ascending order or descending order after the reliability of the polarized channels is calculated based on polarized weights of the polarized channels. As shown in Table 8, it is assumed that the maximum mother code length is equal to 16, a stored construction sequence is (1, 2, 3, 5, 9, 4, 6, 7, 10, 11, 13, 8, 12, 14, 15, 16), and the construction sequence is a sequence obtained by sorting reliability of polarized channels in ascending order. The obtaining, by the transmit end, the information bit set from the polar code construction sequence table based on the information bit length and the target code length of the to-be-encoded information includes: if the mother code length of the to-be-encoded information is equal to 16, and the information bit length of the to-be-encoded information is 6, selecting six information bits (13, 8, 12, 14, 15, 16) having highest reliability from the construction sequence (1, 2, 3, 5, 9, 4, 6, 7, 10, 11, 13, 8, 12, 14, 15, 16) as the information bit set based on the information bit length 6 and the target code length 12; or if the target code length of the to-be-encoded information is equal to 8, and the information bit length of the to-be-encoded information is 4, selecting four information bits (4, 6, 7, 8) having highest reliability from a construction sequence (1, 2, 3, 5, 4, 6, 7, 8) as the information bit set based on the information bit length 4 and the target code length 8. In this embodiment, only one construction sequence needs to be stored, thereby greatly reducing storage overheads of the polar code construction sequence table.

TABLE 8

Polar code construction sequence table in which storage
is performed based on a maximum mother code length

| Maximum mother code length | Construction sequence |
|---|---|
| Nmax = 16 | 1, 2, 3, 5, 9, 4, 6, 7, 10, 11, 13, 8, 12, 14, 15, 16 |

Figure 4:
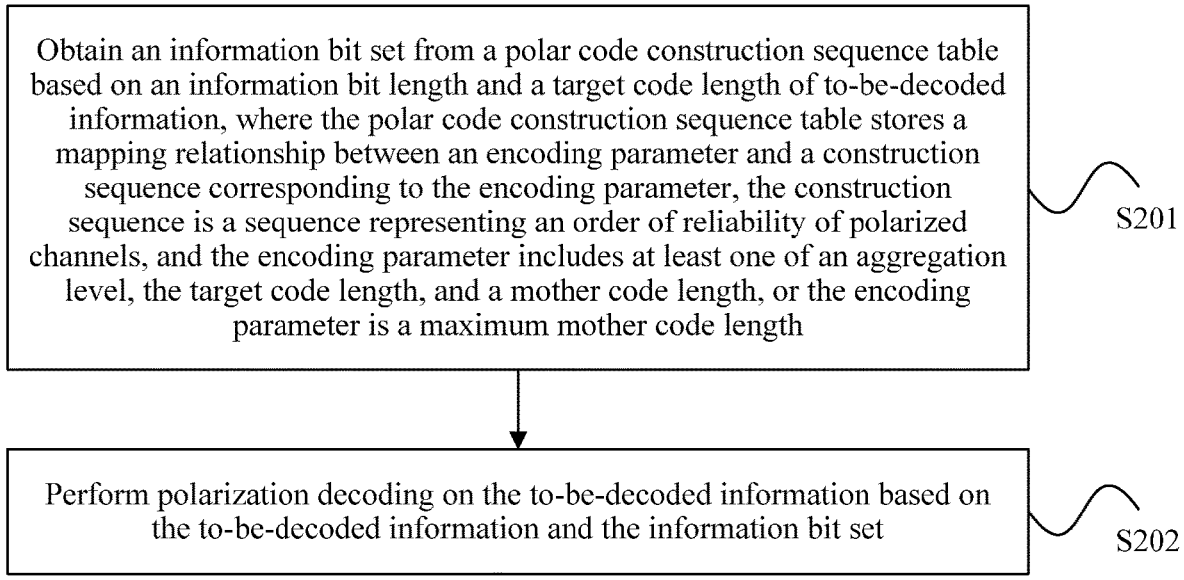
FIG. 4 is a flowchart of an embodiment of a polar code decoding method according to the embodiments of this application.

FIG. 4 is a flowchart of an embodiment of a polar code decoding method according to the embodiments of this application. As shown in FIG. 4, the method in this embodiment may include the following operations:

S201: Obtain an information bit set from a polar code construction sequence table based on an information bit length and a target code length of to-be-decoded information, where the polar code construction sequence table stores a mapping relationship between an encoding parameter and a construction sequence corresponding to the encoding parameter, the construction sequence is a sequence representing an order of reliability of polarized channels, and the encoding parameter includes at least one of an aggregation level, the target code length, and a mother code length, or the encoding parameter is a maximum mother code length.

S202: Decode the to-be-decoded information based on the to-be-decoded information and the information bit set.

In one embodiment, after the information bit set is determined, the to-be-decoded information may be mapped to polarized channels corresponding to the information bit set, and a bit corresponding to a remaining polarized channel is set to a constant value for polar decoding.

In the polar code decoding method provided in this embodiment, the polar code construction sequence table stores the mapping relationship between an encoding parameter and a construction sequence corresponding to the encoding parameter, and the encoding parameter includes at least one of the aggregation level, the target code length, and the mother code length, or the encoding parameter is the maximum mother code length. The construction sequence stored in this embodiment is unrelated to the information bit length, so that storage overheads of the polar code construction sequence table are much lower than those caused when a construction sequence is stored for each different information bit length and each different mother code length in the prior art.

In this embodiment of this application, the mother code length is a code length used when polar encoding is performed, and the target code length is a length M of a bit sequence obtained after encoding and rate matching. The aggregation level represents a quantity of bits that can be carried on a control channel, and a higher aggregation level indicates a larger quantity of bits that can be carried. Usually, aggregation levels are in a one-to-one correspondence with target code lengths. One aggregation level corresponds to one target code length. With a same quantity of information bits, a higher aggregation level indicates a longer code length and a lower code rate.

In this embodiment of this application, the construction sequence is a sequence representing an order of reliability of polarized channels. When the encoding parameter includes at least one of the aggregation level, the target code length, and the mother code length, the construction sequence is a sequence obtained by sorting reliability or normalized reliability of polarized channels in ascending order or descending order or a sequence obtained by sorting error probabilities or normalized error probabilities of polarized channels in ascending order or descending order after the reliability of the polarized channels or the error probabilities of the polarized channels are calculated by using a Gaussion approximation method or a density evolution method. In a feasible manner, one construction sequence corresponding to one encoding parameter value is stored in the polar code construction sequence table. In this case, the obtaining an information bit set from a polar code construction sequence table based on an information bit length and a target code length of to-be-encoded information may include: determining a corresponding first encoding parameter based on the target code length; obtaining, from the polar code construction sequence table, a first construction sequence corresponding to the first encoding parameter; and determining a first information bit set from the first construction sequence based on the information bit length.

In another feasible manner, in the polar code construction sequence table, a same construction sequence (a second construction sequence) corresponding to encoding parameter values less than or equal to a preset encoding parameter threshold may be stored, and one construction sequence corresponding to one encoding parameter value greater than the preset encoding parameter threshold is stored. In this case, the obtaining an information bit set from a polar code construction sequence table based on an information bit length and a target code length of to-be-encoded information may include: determining a corresponding second encoding parameter based on the target code length; and if the second encoding parameter is less than or equal to the encoding parameter threshold, selecting K information bits having highest reliability from the second construction sequence as the information bit set based on an information bit length K and the target code length, where K is a positive integer; or if the second encoding parameter is greater than the encoding parameter threshold, obtaining, from the polar code construction sequence table, a third construction sequence corresponding to the second encoding parameter; and determining the information bit set from the third construction sequence based on the information bit length.

When the encoding parameter is the maximum mother code length, the construction sequence is a sequence obtained by sorting reliability or normalized reliability of polarized channels in ascending order or descending order after the reliability of the polarized channels is calculated based on polarized weights of the polarized channels. The polar code construction sequence table stores the third construction sequence corresponding to the maximum mother code length. In this case, the obtaining an information bit set from a polar code construction sequence table based on an information bit length and a target code length of to-be-encoded information may include: determining a mother code length N based on an information bit length K and the target code length, and selecting information bits corresponding to K polarized channels that have highest reliability and that are of N polarized channels from the third construction sequence as the information bit set, where N and K are positive integers.

For details of content stored in the polar code construction sequence table, refer to the example at the encoding side shown in FIG. 3. Details are not described herein again.

Function modules of a sending device and a receiving device may be obtained through division according to the method examples in the embodiments of this application. For example, function modules corresponding to various functions may be obtained through division, or two or more functions may be integrated into one processing module. The integrated module may be implemented in a form of hardware, or may be implemented in a form of a software function module. It should be noted that, in the embodiments of this application, module division is an example, and is merely a logical function division. In actual implementation, another division manner may be used.

Figure 5:
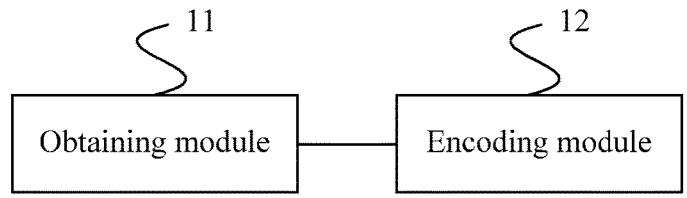
FIG. 5 is a schematic structural diagram of an embodiment of a polar code encoding apparatus according to the embodiments of this application.

FIG. 5 is a schematic structural diagram of an embodiment of a polar code encoding apparatus according to the embodiments of this application. As shown in FIG. 5, the apparatus in this embodiment may include: an obtaining module 11 and an encoding module 12. The obtaining module 11 is configured to obtain an information bit set from a polar code construction sequence table based on an information bit length and a target code length of to-be-encoded information. The polar code construction sequence table stores a mapping relationship between an encoding parameter and a construction sequence corresponding to the encoding parameter, the construction sequence is a sequence representing an order of reliability of polarized channels, and the encoding parameter includes at least one of an aggregation level, the target code length, and a mother code length, or the encoding parameter is a maximum mother code length. The encoding module 12 is configured to perform polarization encoding on the to-be-encoded information based on the to-be-encoded information and the information bit set.

The aggregation level represents a quantity of bits that can be carried on a control channel, and aggregation levels are in a one-to-one correspondence with target code lengths.

In a feasible manner, when the encoding parameter includes at least one of the aggregation level, the target code length, and the mother code length, one construction sequence corresponding to one encoding parameter value is stored in the polar code construction sequence table. The obtaining module 11 is configured to: determine a corresponding first encoding parameter based on the target code length; obtain, from the polar code construction sequence table, a first construction sequence corresponding to the first encoding parameter; and determine a first information bit set from the first construction sequence based on the information bit length.

In another feasible manner, when the encoding parameter includes at least one of the aggregation level, the target code length, and the mother code length, in the polar code construction sequence table, a same construction sequence (a second construction sequence) corresponding to encoding parameter values less than or equal to a preset encoding parameter threshold may be stored, and one construction sequence corresponding to one encoding parameter value greater than the preset encoding parameter threshold is stored. The obtaining module 11 is configured to: determine a corresponding second encoding parameter based on the target code length; and if the second encoding parameter is less than or equal to the encoding parameter threshold, select K information bits having highest reliability from the second construction sequence as the information bit set based on an information bit length K and the target code length, where K is a positive integer; or if the second encoding parameter is greater than the encoding parameter threshold, obtain, from the polar code construction sequence table, a third construction sequence corresponding to the second encoding parameter; and determine the information bit set from the third construction sequence based on the information bit length.

In one embodiment, when the encoding parameter is the maximum mother code length, the polar code construction sequence table stores a third construction sequence corresponding to the maximum mother code length. Therefore, the obtaining module 11 is configured to select K information bits having highest reliability from a third construction sequence as the information bit set based on an information bit length K and the target code length, where K is a positive integer.

In this embodiment, when the encoding parameter includes at least one of the aggregation level, the target code length, and the mother code length, the construction sequence may be a sequence obtained by sorting reliability or normalized reliability of polarized channels in ascending order or descending order or a sequence obtained by sorting error probabilities or normalized error probabilities of polarized channels in ascending order or descending order after the reliability of the polarized channels or the error probabilities of the polarized channels are calculated by using a Gaussion approximation method or a density evolution method.

When the encoding parameter is the maximum mother code length, the construction sequence is a sequence obtained by sorting reliability or normalized reliability of polarized channels in ascending order or descending order after the reliability of the polarized channels is calculated based on polarized weights of the polarized channels.

The encoding apparatus in this embodiment may be used to perform the technical solutions of the method embodiment shown in FIG. 3. Implementation principles and technical effects of the apparatus are similar to those of the method. Details are not described herein again.

Figure 6:
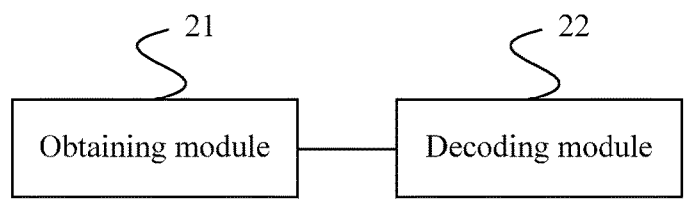
FIG. 6 is a schematic structural diagram of an embodiment of a polar code decoding apparatus according to the embodiments of this application.

FIG. 6 is a schematic structural diagram of an embodiment of a polar code decoding apparatus according to the embodiments of this application. As shown in FIG. 6, the apparatus in this embodiment may include: an obtaining module 21 and a decoding module 22. The obtaining module 21 is configured to obtain an information bit set from a polar code construction sequence table based on an information bit length and a target code length of to-be-decoded information. The polar code construction sequence table stores a mapping relationship between an encoding parameter and a construction sequence corresponding to the encoding parameter, the construction sequence is a sequence representing an order of reliability of polarized channels, and the encoding parameter includes at least one of an aggregation level, the target code length, and a mother code length, or the encoding parameter is a maximum mother code length. The decoding module 22 is configured to decode the to-be-decoded information based on the to-be-decoded information and the information bit set.

The aggregation level represents a quantity of bits that can be carried on a control channel, and aggregation levels are in a one-to-one correspondence with target code lengths.

In a feasible manner, when the encoding parameter includes at least one of the aggregation level, the target code length, and the mother code length, one construction sequence corresponding to one encoding parameter value is stored in the polar code construction sequence table. The obtaining module 21 is configured to: determine a corresponding first encoding parameter based on the target code length; obtain, from the polar code construction sequence table, a first construction sequence corresponding to the first encoding parameter; and determine a first information bit set from the first construction sequence based on the information bit length.

In another feasible manner, when the encoding parameter includes at least one of the aggregation level, the target code length, and the mother code length, in the polar code construction sequence table, a same construction sequence (a second construction sequence) corresponding to encoding parameter values less than or equal to a preset encoding parameter threshold may be stored, and one construction sequence corresponding to one encoding parameter value greater than the preset encoding parameter threshold is stored. The obtaining module 21 is configured to: determine a corresponding second encoding parameter based on the target code length; and if the second encoding parameter is less than or equal to the encoding parameter threshold, select K information bits having highest reliability from the second construction sequence as the information bit set based on an information bit length K and the target code length, where K is a positive integer; or if the second encoding parameter is greater than the encoding parameter threshold, obtain, from the polar code construction sequence table, a third construction sequence corresponding to the second encoding parameter; and determine the information bit set from the third construction sequence based on the information bit length.

In one embodiment, when the encoding parameter is the maximum mother code length, the polar code construction sequence table stores a third construction sequence corresponding to the maximum mother code length. Therefore, the obtaining module 21 is configured to select K information bits having highest reliability from a third construction sequence as the information bit set based on an information bit length K and the target code length, where K is a positive integer.

In this embodiment, when the encoding parameter includes at least one of the aggregation level, the target code length, and the mother code length, the construction sequence may be a sequence obtained by sorting reliability or normalized reliability of polarized channels in ascending order or descending order or a sequence obtained by sorting error probabilities or normalized error probabilities of polarized channels in ascending order or descending order after the reliability of the polarized channels or the error probabilities of the polarized channels are calculated by using a Gaussion approximation method or a density evolution method.

When the encoding parameter is the maximum mother code length, the construction sequence is a sequence obtained by sorting reliability or normalized reliability of polarized channels in ascending order or descending order after the reliability of the polarized channels is calculated based on polarized weights of the polarized channels.

The decoding apparatus in this embodiment may be used to perform the technical solutions of the method embodiment shown in FIG. 4. Implementation principles and technical effects of the apparatus are similar to those of the method. Details are not described herein again.

Figure 7:
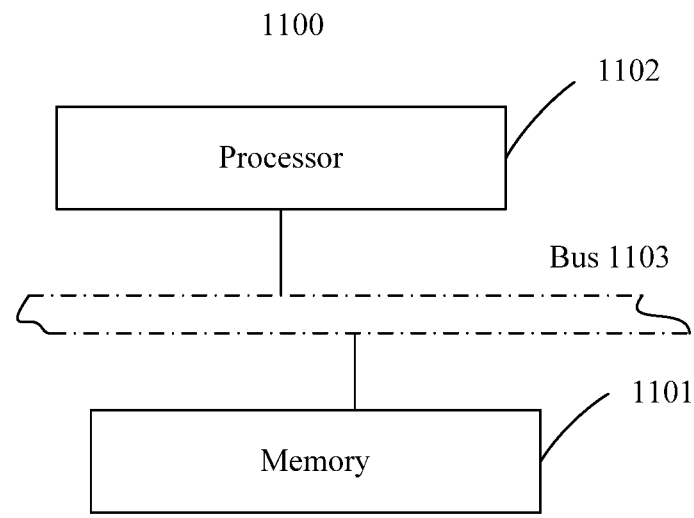
FIG. 7 is a schematic diagram of another polar code encoding apparatus according to an embodiment of this application.

FIG. 7 is a schematic diagram of another polar code encoding apparatus according to an embodiment of this application. The apparatus 1100 includes a memory 1101 and a processor 1102.

The memory 1101 is configured to store a program instruction, and the memory may be a flash (a flash memory).

The processor 1102 is configured to: invoke and execute the program instruction in the memory, to perform the operations in the encoding method shown in FIG. 3. For details, refer to the related descriptions in the foregoing method embodiment.

In one embodiment, the memory 1101 may be independent, or may be integrated with the processor 1102.

When the memory 1101 is a device independent of the processor 1102, the apparatus 1100 may further include:

a bus 1103, configured to connect the memory and the processor. The encoding apparatus in FIG. 7 may further include a transmitter (not drawn in the figure), configured to send an encoded sequence obtained after the processor 1102 performs polar encoding.

Figure 8:
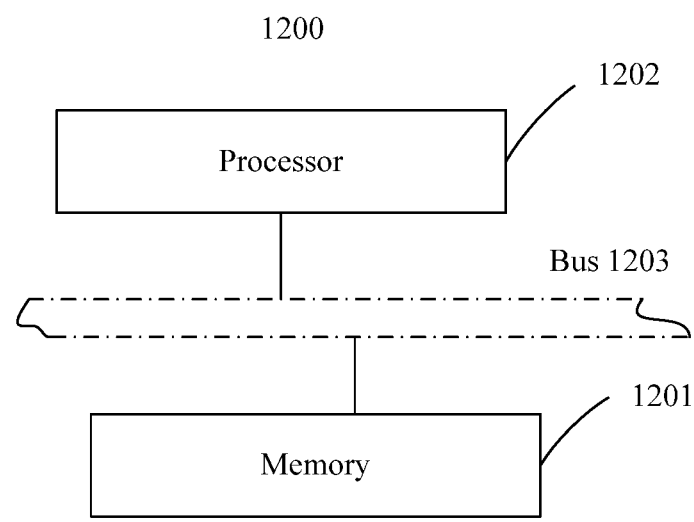
FIG. 8 is a schematic diagram of another polar code decoding apparatus according to an embodiment of this application.

FIG. 8 is a schematic diagram of another polar code decoding apparatus according to an embodiment of this application. The apparatus 1200 includes a memory 1201 and a processor 1202.

The memory 1201 is configured to store an executable instruction, and the memory may be a flash (a flash memory).

The processor 1202 is configured to execute the executable instruction stored in the memory, to perform the operations in the decoding method shown in FIG. 4. For details, refer to the related descriptions in the foregoing method embodiment.

In one embodiment, the memory 1201 may be independent, or may be integrated with the processor 1202.

When the memory 1201 is a device independent of the processor 1202, the apparatus 1200 may further include:

a bus 1203, configured to connect the memory 1201 and the processor 1202.

The decoding apparatus in FIG. 8 may further include a receiver (not drawn in the figure), configured to: receive a to-be-decoded signal, and send the to-be-decoded signal to the processor 1202.

The encoding apparatus or the decoding apparatus in the embodiments of this application may be any communications apparatus having a wireless communication function, such as an access point, a station, user equipment, or a base station.

A person skilled in the art may understand that the encoding method or the decoding method in the embodiments of this application may be implemented by using hardware or a combination of software and hardware. In many cases, a communications apparatus in a communications system has both a receiving function and a sending function. The communications apparatus may function as a transmit end to send information to a receive end, or may function as a receive end to receive information to a transmit end. Therefore, the communications apparatus has both an encoding function and a decoding function. The communications apparatus may be configured as a general-purpose processing system, and for example, is collectively referred to as a chip. The general-purpose processing system includes: one or more microprocessors providing a processor function, and an external storage providing at least some storage media. All these may be connected to another support circuit by using an external bus system structure.

The communications apparatus may include an ASIC (application-specific integrated circuit) including a processor, a bus interface, and a user interface; and at least one part of a storage medium integrated in a single chip. Alternatively, the communications apparatus includes one or more FPGAs (field programmable gate array), a PLD (programmable logic device), a controller, a state machine, gate logic, a discrete hardware component, any other suitable circuit, or any combination of circuits that can execute the functions described in the embodiments of this application.

An embodiment of this application further provides a readable storage medium. The readable storage medium stores an executable instruction. When at least one processor of an encoding apparatus executes the executable instruction, the encoding apparatus performs the encoding method provided in the foregoing embodiments.

An embodiment of this application further provides a readable storage medium. The readable storage medium stores an executable instruction. When at least one processor of a decoding apparatus executes the executable instruction, the decoding apparatus performs the decoding method provided in the foregoing embodiments.

An embodiment of this application further provides a program product. The program product includes an executable instruction, and the executable instruction is stored in a readable storage medium. At least one processor of an encoding apparatus may read the executable instruction from the readable storage medium, and the at least one processor executes the executable instruction, so that the encoding apparatus performs the encoding method provided in the foregoing embodiments.

An embodiment of this application further provides a program product. The program product includes an executable instruction, and the executable instruction is stored in a readable storage medium. At least one processor of a decoding apparatus may read the executable instruction from the readable storage medium, and the at least one processor executes the executable instruction, so that the decoding apparatus performs the decoding method provided in the foregoing embodiments.

All or some of the foregoing embodiments may be implemented by using software, hardware, firmware, or any combination thereof. When software is used to implement the embodiments, the embodiments may be implemented all or partially in a form of a computer program product. The computer program product includes one or more computer instructions. When the computer program instructions are loaded and executed on a computer, the procedure or functions according to the embodiments of the present application are all or partially generated. The computer may be a general-purpose computer, a dedicated computer, a computer network, or another programmable apparatus. The computer instruction may be stored in a computer readable storage medium, or may be transmitted by using the computer readable storage medium. The computer instruction may be transmitted from a website, computer, server, or data center to another website, computer, server, or data center in a wired (such as a coaxial cable, an optical fiber, or a digital subscriber line (DSL)) or wireless (such as infrared, radio, or microwave) manner. The computer readable storage medium may be any usable medium accessible by a computer, or a data storage device, such as a server or a data center, integrating one or more usable media. The usable medium may be a magnetic medium (such as a floppy disk, a hard disk, a magnetic tape, a USB flash drive, a ROM, or a RAM), an optical medium (such as a CD or a DVD), a semiconductor medium (for example, a solid state disk (SSD)), or the like.

The invention claimed is:

1. A method for polar code encoding comprising:
obtaining an information bit set from a polar code construction sequence table based on an information bit length and a target code length of to-be-encoded information, the polar code construction sequence table stores a mapping relationship between an encoding parameter and a construction sequence corresponding to the encoding parameter, wherein the construction sequence is a sequence representing an order of reliability of polarized channels, and the encoding parameter comprises at least one of an aggregation level, the target code length, and a mother code length, or the encoding parameter is a maximum mother code length; and
performing polarization encoding on the to-be-encoded information based on the to-be-encoded information and the information bit set.

2. The method according to claim 1, wherein the encoding parameter comprises at least one of the aggregation level, the target code length, and the mother code length, and one construction sequence corresponding to one encoding parameter value is stored in the polar code construction sequence table.

3. The method according to claim 2, wherein the obtaining an information bit set from a polar code construction sequence table based on an information bit length and a target code length of to-be-encoded information comprises:
determining a corresponding first encoding parameter based on the target code length;

obtaining, from the polar code construction sequence table, a first construction sequence corresponding to the first encoding parameter; and determining a first information bit set from the first construction sequence based on the information bit length.

4. The method according to claim 1, wherein the encoding parameter comprises at least one of the aggregation level, the target code length, and the mother code length, in the polar code construction sequence table, encoding parameter values less than or equal to a preset encoding parameter threshold correspond to a same second construction sequence, and one construction sequence corresponding to one encoding parameter value greater than the preset encoding parameter threshold is stored.

5. The method according to claim 4, wherein the obtaining an information bit set from a polar code construction sequence table based on an information bit length and a target code length of to-be-encoded information comprises:

determining a corresponding second encoding parameter based on the target code length; and if the second encoding parameter is less than or equal to the preset encoding parameter threshold, selecting K information bits having highest reliability from the second construction sequence as the information bit set based on an information bit length K and the target code length, wherein K is a positive integer; or if the second encoding parameter is greater than the encoding parameter threshold, obtaining, from the polar code construction sequence table, a third construction sequence corresponding to the second encoding parameter; and determining the information bit set from the third construction sequence based on the information bit length.

6. The method according to claim 1, wherein the encoding parameter is the maximum mother code length, and the polar code construction sequence table stores a third construction sequence corresponding to the maximum mother code length.

7. The method according to claim 6, wherein the obtaining an information bit set from a polar code construction sequence table based on an information bit length and a target code length of to-be-encoded information comprises:

determining a mother code length N based on an information bit length K and the target code length, and selecting information bits corresponding to K polarized channels that have highest reliability and that are of N polarized channels from the third construction sequence as the information bit set, wherein N and K are positive integers.

8. A polar code encoding apparatus, comprising:

a memory and a processor, wherein the memory is configured to store a program instruction; and the processor is configured to:

obtain an information bit set from a polar code construction sequence table based on an information bit length and a target code length of to-be-encoded information, the polar code construction sequence table stores a mapping relationship between an encoding parameter and a construction sequence corresponding to the encoding parameter, wherein the construction sequence is a sequence representing an order of reliability of polarized channels, and the encoding parameter comprises at least one of an aggregation level, the target code length, and a mother code length, or the encoding parameter is a maximum mother code length; and perform polarization encoding on the to-be-encoded information based on the to-be-encoded information and the information bit set.

9. The apparatus according to claim 8, wherein the encoding parameter comprises at least one of the aggregation level, the target code length, and the mother code length, and one construction sequence corresponding to one encoding parameter value is stored in the polar code construction sequence table.

10. The apparatus according to claim 9, wherein the processor is configured to:

determine a corresponding first encoding parameter based on the target code length;

obtain, from the polar code construction sequence table, a first construction sequence corresponding to the first encoding parameter; and determine a first information bit set from the first construction sequence based on the information bit length.

11. The apparatus according to claim 8, wherein the encoding parameter comprises at least one of the aggregation level, the target code length, and the mother code length in the polar code construction sequence table, encoding parameter values less than or equal to a preset encoding parameter threshold correspond to a same second construction sequence, and one construction sequence corresponding to one encoding parameter value greater than the preset encoding parameter threshold is stored.

12. The apparatus according to claim 11, wherein the processor is configured to:

determine a corresponding second encoding parameter based on the target code length; and if the second encoding parameter is less than or equal to the encoding parameter threshold, select K information bits having highest reliability from the second construction sequence as the information bit set based on an information bit length K and the target code length, wherein K is a positive integer; or if the second encoding parameter is greater than the encoding parameter threshold, obtain, from the polar code construction sequence table, a third construction sequence corresponding to the second encoding parameter; and determine the information bit set from the third construction sequence based on the information bit length.

13. A chip, comprising a memory and a processor, wherein the memory is configured to store an executable instruction, and the processor is configured to:

obtain an information bit set from a polar code construction sequence table based on an information bit length and a target code length of to-be-encoded information, the polar code construction sequence table stores a mapping relationship between an encoding parameter and a construction sequence corresponding to the encoding parameter, wherein the construction sequence is a sequence representing an order of reliability of polarized channels, and the encoding parameter comprises at least one of an aggregation level, the target code length, and a mother code length, or the encoding parameter is a maximum mother code length; and perform polarization encoding on the to-be-encoded information based on the to-be-encoded information and the information bit set.

14. The chip according to claim 13, wherein the encoding parameter comprises at least one of the aggregation level, the target code length, and the mother code length, and one construction sequence corresponding to one encoding parameter value is stored in the polar code construction sequence table.

15. The chip according to claim 14, wherein the processor is configured to:
    determine a corresponding first encoding parameter based on the target code length;
    obtain, from the polar code construction sequence table, a first construction sequence corresponding to the first encoding parameter; and
    determine a first information bit set from the first construction sequence based on the information bit length.

16. The chip according to claim 13, wherein the encoding parameter comprises at least one of the aggregation level, the target code length, and the mother code length, in the polar code construction sequence table, encoding parameter values less than or equal to a preset encoding parameter threshold correspond to a same second construction sequence, and one construction sequence corresponding to one encoding parameter value greater than the preset encoding parameter threshold is stored.

17. The chip according to claim 13, wherein the processor is configured to:
    determine a corresponding second encoding parameter based on the target code length; and
    if the second encoding parameter is less than or equal to the encoding parameter threshold, select K information bits having highest reliability from the second construction sequence as the information bit set based on an information bit length K and the target code length, wherein K is a positive integer; or
    if the second encoding parameter is greater than the encoding parameter threshold, obtain, from the polar code construction sequence table, a third construction sequence corresponding to the second encoding parameter; and
    determine the information bit set from the third construction sequence based on the information bit length.

* * * * *